United States Patent
Taoka

(10) Patent No.: US 11,404,564 B2
(45) Date of Patent: Aug. 2, 2022

(54) INTEGRATED CIRCUIT HAVING A TRANSISTOR, A DIODE, AND A TEMPERATURE SENSOR

(71) Applicant: FUJI ELECTRIC CO., LTD., Kanagawa (JP)

(72) Inventor: Masahiro Taoka, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 450 days.

(21) Appl. No.: 16/208,377

(22) Filed: Dec. 3, 2018

(65) Prior Publication Data
US 2019/0252532 A1  Aug. 15, 2019

(30) Foreign Application Priority Data
Feb. 15, 2018  (JP) .............. JP2018-025062

(51) Int. Cl.
| | |
|---|---|
| *H01L 29/739* | (2006.01) |
| *H01L 27/06* | (2006.01) |
| *G01K 7/01* | (2006.01) |
| *H01L 29/08* | (2006.01) |
| *H01L 29/417* | (2006.01) |
| *H01L 27/07* | (2006.01) |
| *H01L 27/02* | (2006.01) |
| *H01L 29/06* | (2006.01) |

(52) U.S. Cl.
CPC .......... *H01L 29/7397* (2013.01); *G01K 7/01* (2013.01); *H01L 27/0211* (2013.01); *H01L 27/0664* (2013.01); *H01L 27/0727* (2013.01); *H01L 29/0692* (2013.01); *H01L 29/0696* (2013.01); *H01L 29/0804* (2013.01); *H01L 29/0821* (2013.01); *H01L 29/41708* (2013.01); *H01L 27/0629* (2013.01)

(58) Field of Classification Search
CPC ... G01K 7/01; H01L 27/0211; H01L 27/0207; H01L 27/0727; H01L 29/0692; H01L 29/0696
See application file for complete search history.

(56) References Cited

U.S. PATENT DOCUMENTS

| | | | | |
|---|---|---|---|---|
| 10,121,866 | B2 * | 11/2018 | Naito | .................. H01L 29/0696 |
| 2016/0336435 | A1 * | 11/2016 | Naito | .................. H01L 27/0635 |
| 2017/0236908 | A1 | 8/2017 | Naito | |
| 2018/0350960 | A1 * | 12/2018 | Naito | .................... H01L 21/743 |

FOREIGN PATENT DOCUMENTS

| | | | | |
|---|---|---|---|---|
| JP | 2008235405 | A | 10/2008 | |
| JP | 2016012647 | A | 1/2016 | |
| JP | 2017147435 | A | 8/2017 | |
| WO | WO-2019078166 | A1 * | 4/2019 | ........... H01L 27/088 |

* cited by examiner

*Primary Examiner* — Kevin Parendo

(57) ABSTRACT

A semiconductor device including a transistor section and a diode section, the semiconductor device having: a temperature sensing section; a neighboring transistor section adjacent to the temperature sensing section; a neighboring diode section adjacent to the temperature sensing section; and a first non-neighboring diode section that is not adjacent to the temperature sensing section, wherein the first non-neighboring diode section has a pattern different from the pattern of the neighboring diode section in the top view is provided.

11 Claims, 7 Drawing Sheets

INTEGRATED CIRCUIT HAVING A TRANSISTOR, A DIODE, AND A TEMPERATURE SENSOR

The contents of the following Japanese patent application(s) are incorporated herein by reference:
NO. 2018-025062 filed in JP on Feb. 15, 2018.

BACKGROUND

1. Technical Field

The present invention relates to a semiconductor device.

2. Related Art

Conventionally, temperature sensing sections are known to be provided to a semiconductor device including transistor sections and diode sections (for example, refer to Patent documents 1 and 2).
Patent document 1: Japanese Patent Application, Publication No. 2016-012647
Patent document 2: Japanese Patent Application, Publication No. 2008-235405
In semiconductor devices, it is preferable to improve accuracy in detection of temperature of the semiconductor device.

SUMMARY

In the first aspect of the present invention, a semiconductor device includes a transistor section and a diode section, and the semiconductor device may include: a temperature sensing section; a neighboring transistor section adjacent to the temperature sensing section; a neighboring diode section adjacent to the temperature sensing section; and a first non-neighboring diode section that is not adjacent to the temperature sensing section. The first non-neighboring diode section may have a pattern different from the pattern of the neighboring diode section in the top view.

The temperature sensing section has a longer side and a shorter side, and may be, on the shorter side, adjacent to only one of the neighboring transistor section and the neighboring diode section.

The transistor section may have a non-neighboring transistor section that is not adjacent to the temperature sensing section. The neighboring diode section and the neighboring transistor section may be adjacent to the longer side of the temperature sensing section and arrayed in the longitudinal direction.

The semiconductor device may further include a second non-neighboring diode section that is not adjacent to the temperature sensing section. The second non-neighboring diode section and the non-neighboring transistor section may be arrayed in the longitudinal direction on the opposite side to the temperature sensing section, in the reversed order of the arrangement of the neighboring diode section and the neighboring transistor section that are arrayed in the longitudinal direction.

The second non-neighboring diode section may have the same pattern as the pattern of the neighboring diode section in the top view.

The neighboring transistor section and the neighboring diode section may have a longitudinal direction in an extending direction of trench portions included in the transistor section.

The neighboring diode section may have a longitudinal direction in a direction orthogonal to the longitudinal direction of the temperature sensing section. The first non-neighboring diode section may have a longitudinal direction in a direction parallel to the longitudinal direction of the temperature sensing section.

At least one of the neighboring diode section and the neighboring transistor section may be adjacent to the temperature sensing section on one side thereof at two points.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiments) do(es) not limit the invention according to the claims, and all the combinations of the features described in the embodiment(s) are not necessarily essential to means provided by aspects of the invention.

In the present specification, one side in a direction parallel to a depth direction of a semiconductor substrate is referred to as "above", and the other side is referred to as "below". One surface of two principal surfaces of a substrate, a layer, or some other member is referred to as an upper surface, and the other surface is referred to as a lower surface. The "above" and "below" directions are not limited by the direction of gravity or a direction of attachment to a substrate or the like at the time of implementation of a semiconductor device. In the present specification, a view from an upper surface side of the semiconductor substrate is referred to as "top view".

In the present specification, technical matters may be described using orthogonal coordinate axes of X-axis, Y-axis and Z-axis. In the present specification, a plane parallel to an upper surface of the semiconductor substrate is regarded as XY-plane, and the depth direction of the semiconductor substrate is regarded as the Z-axis.

Although, in each example shown, the first conductivity type is N-type and the second conductivity type is P-type, the first conductivity type may be P-type, and the second conductivity type may be N-type. In this case, conductivity types of substrates, layers, regions and the like in each example respectively have the opposite polarities. Also, N or P respectively means that electrons or holes are majority carriers. A sign (+) or (−) added to N or P means that N(+)

or P(+) has higher carrier concentration and N(−) or P(−) has lower carrier concentration than the carrier concentration of N or P.

In the present specification, doping concentration refers to concentration of impurities that have been formed into donors or acceptors. In the present specification, difference in concentrations of donors and acceptors may be regarded as doping concentration. Also, if doping concentration distribution in the doped region has a peak, the peak value may be referred to as doping concentration in the doped region. If doping concentration in the doped region is approximately uniform in its distribution or in similar situation, a value obtained by averaging the doping concentration distribution in the doped region may be referred to as doping concentration.

Figure 1:
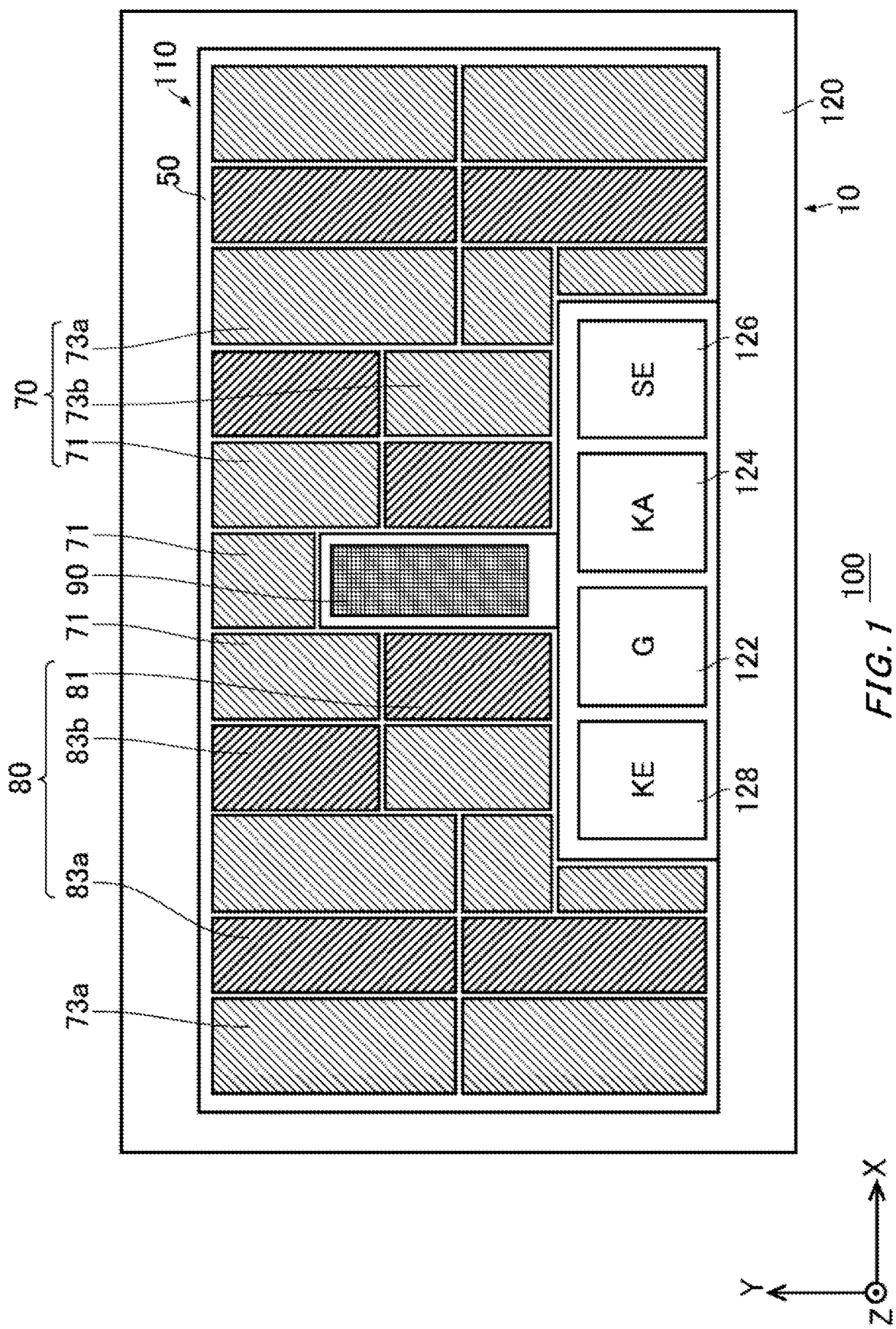
FIG. 1 shows an exemplary top view of a semiconductor device 100 according to the example 1.

FIG. 1 shows an exemplary top view of a semiconductor device 100 according to the example 1. The semiconductor device 100 is a semiconductor chip that includes a transistor portion 70 and a diode portion 80. The semiconductor device 100 may include a temperature sensing section 90, and may be mounted on a module such as an IPM (Intelligent Power Module).

The transistor section 70 includes a transistor such as an IGBT (Insulated Gate Bipolar Transistor). The diode section 80 includes a diode such as a free wheel diode (FWD). The semiconductor device 100 in the present example is a Reverse Conducting IGBT (RC-IGBT) that has the transistor section 70 and the diode section 80 in the same chip.

The semiconductor substrate 10 may be a silicon substrate, a silicon carbide substrate, or a nitride semiconductor substrate such as a gallium nitride semiconductor substrate or the like. The semiconductor substrate 10 in the present example is a silicon substrate. The semiconductor substrate 10 has an active region 110 and an outer peripheral region 120.

The transistor section 70 includes a plurality of regions obtained by virtually projecting collector regions that are provided on the lower surface side of the semiconductor substrate 10 on the upper surface of the semiconductor substrate 10. The collector regions have second conductivity type. The collector regions have P(+)-type, as an example.

The diode section 80 is a plurality of regions obtained by virtually projecting cathode regions that are provided on the lower surface side of the semiconductor substrate 10 on the upper surface of the semiconductor substrate 10. The cathode regions have first conductivity type. The cathode regions in the present example have N(+)-type, as an example.

The transistor section 70 and the diode section 80 may be arrayed alternately and periodically in XY plane. The transistor section 70 and the diode section 80 in the present example have a plurality of transistor sections and diode sections, respectively. In regions between the transistor section 70 and the diode section 80, a gate metal layer 50 may be provided above the semiconductor substrate 10.

Note that the transistor section 70 and the diode section 80 in the present example have trench portions extending in Y axis direction. However, the transistor section 70 and the diode section 80 may have trench portions extending in X axis direction.

The active region 110 has the transistor section 70 and the diode section 80. The active region 110 is a region where main current flows between the upper surface and the lower surface of the semiconductor substrate 10 if the semiconductor device 100 is controlled in ON state. That is, the active region 110 is a region where current flows in the semiconductor substrate 10 in a depth direction from the upper surface to the lower surface or from the lower surface to the upper surface of the semiconductor substrate 10. In the present specification, the transistor section 70 and the diode section 80 are each referred to as an element section or an element region.

Note that, in the top view, regions sandwiched by the two element sections are also regarded as the active region 110. In the present example, regions where the gate metal layer 50 is provided being sandwiched by the element sections are also regarded as the active region 110.

The gate metal layer 50 may be formed of aluminum, aluminum-silicon alloy, or aluminum-silicon-copper alloy. The gate metal layer 50 is electrically connected to gate conductive portions of the transistor section 70 and supplies gate voltage to the transistor section 70. In the top view, the gate metal layer 50 is provided so as to surround the outer periphery of the active region 110. The gate metal layer 50 is electrically connected to a gate pad 122 provided in the outer peripheral region 120. The gate metal layer 50 may be provided along the outer peripheral edge of the semiconductor substrate 10. Also, in the top view, the gate metal layer 50 may be provided surrounding the temperature sensing section 90, or between the transistor section 70 and the diode section 80.

The outer peripheral region 120 is a region between the active region 110 and the outer peripheral edge of the semiconductor substrate 10 in the top view. The outer peripheral region 120 is provided surrounding the active region 110 in the top view. In the outer peripheral region 120, one or more metal pads for connecting the semiconductor device 100 and external devices with wires or the like may be arranged. Note that the outer peripheral region 120 may have an edge termination structure portion. The edge termination structure portion relaxes electric field concentration on the upper surface side of the semiconductor substrate 10. For example, the edge termination structure portion has a guard ring, a field plate, a resurf, and a structure of any combination thereof. In the outer peripheral region 120, a gate pad 122, a temperature measuring pad 124, a current sensing pad 126, and a Kelvin pad 128 are provided.

The gate pad 122 is electrically connected to the gate conductive portion of the transistor section 70. The temperature measuring pad 124 is electrically connected to the temperature sensing section 90. The current sensing pad 126 detects current flowing through a current sensing element that is arranged between a power source and load, or between the ground and load. The Kelvin pad 128 is electrically connected to an emitter electrode provided above the active region 110.

The temperature sensing section 90 is provided above the active region 110. The temperature sensing section 90 detects temperature of the active region 110. The temperature sensing section 90 may be a pn-type temperature sensing diode that is formed of monocrystalline or polycrystalline silicon. The temperature sensing section 90 is used to detect the temperature of the semiconductor device 100 and protect the semiconductor chip from overheat. The temperature sensing section 90 is connected to a constant current source. If the temperature of the semiconductor device 100 changes, forward voltage of the current flowing through the temperature sensing section 90 changes. Based on the change in the forward voltage, the semiconductor device 100 can detect the temperature. The temperature sensing section 90 has the longitudinal direction in Y axis direction and the transverse direction in X axis direction, but the way of determining directions is not limited to this.

The temperature sensing section 90 in the present example is provided around the center of the active region 110 in the top view. The temperature sensing section 90 may be provided in either the transistor section 70 or the diode section 80.

That is, on the lower surface side of the semiconductor substrate 10 where the temperature sensing section 90 is provided, a collector region having second conductivity type, or a cathode region having first conductivity type may be provided. The temperature sensing section 90 is provided adjacent to the transistor section 70 and the diode section 80.

In the present specification, that the transistor section 70 is adjacent to the temperature sensing section 90 refers to that the diode section 80 is not provided between the transistor section 70 and the temperature sensing section 90. Also, that the diode section 80 is adjacent to the temperature sensing section 90 refers to that the transistor section 70 is not provided between the diode section 80 and the temperature sensing section 90. The temperature sensing section 90, on each of the sides, may be adjacent to either the transistor section 70 or the diode section 80. The temperature sensing section 90, on one of the sides, may be adjacent to both the transistor section 70 and the diode section 80.

A temperature sensing wire (not shown) is electrically connected to the temperature sensing section 90. The temperature sensing wire is provided above the active region 110 in the top view. Also, the temperature sensing wire is provided extending to the outer peripheral region 120. The temperature sensing wire in the present example is provided extending in Y axis direction from the temperature sensing section 90. The temperature sensing wire is connected to the temperature measuring pad 124 provided in the outer peripheral region 120. Current flowing from the temperature measuring pad 124 flows through the temperature sensing wire to the temperature sensing section 90.

The transistor section 70 is provided such that at least part of the transistor section 70 is adjacent to the temperature sensing section 90. The transistor section 70 in the present example has a longer side and a shorter side. The transistor section 70 includes a neighboring transistor section 71 and a non-neighboring transistor section 73. That is, the transistor section 70 has the longitudinal direction in Y axis direction.

The neighboring transistor section 71 is provided adjacent to the temperature sensing section 90. The neighboring transistor section 71 has a longitudinal direction in a direction parallel to the longitudinal direction of the temperature sensing section 90. The neighboring transistor section 71 has a longitudinal direction in the extending direction of the trench portion included in the transistor section 70. That is, the neighboring transistor section 71 has the longitudinal direction in Y axis direction.

The non-neighboring transistor section 73 is not adjacent to the temperature sensing section 90. The non-neighboring transistor section 73 has a longitudinal direction in a direction parallel to the longitudinal direction of the temperature sensing section 90. That is, the non-neighboring transistor section 73 has the longitudinal direction in Y axis direction. The non-neighboring transistor section 73 includes a non-neighboring transistor section 73a and a non-neighboring transistor section 73b.

The non-neighboring transistor section 73a has a pattern different from the pattern of the neighboring transistor section 71 in the top view. In the present specification, patterns refer to outer periphery shapes of the transistor section 70 and the diode section 80 in the top view. The non-neighboring transistor section 73a in the present example has the longer side in Y axis direction and the shorter side in X axis direction. The non-neighboring transistor section 73a has lengths different from the lengths of neighboring transistor section 71 in the longitudinal direction and in the transverse direction. The non-neighboring transistor section 73a is an example of a first non-neighboring transistor section.

The non-neighboring transistor section 73b has a pattern different from the pattern of the non-neighboring transistor section 73a in the top view. The non-neighboring transistor section 73b has the same pattern as the pattern of the neighboring transistor section 71 in the top view. The non-neighboring transistor section 73b in the present example has a longer side in Y axis direction and a shorter side in X axis direction. The non-neighboring transistor section 73b has the same lengths as the lengths of the neighboring transistor section 71 in the longitudinal direction and in the transverse direction. The non-neighboring transistor section 73b is an example of a second non-neighboring transistor section.

The neighboring diode section 81 is adjacent to the temperature sensing section 90. The neighboring diode section 81 in the present example has a longer side and a shorter side. The neighboring diode section 81 has the longitudinal direction in the extending direction of the trench portion included in the transistor section 70. The neighboring transistor section 71 and the neighboring diode section 81 in the present example have the same width in X axis direction. However, the neighboring transistor section 71 and the neighboring diode section 81 may have different widths. The neighboring transistor section 71 may have an area greater than the area of the neighboring diode section 81.

The non-neighboring diode section 83 is not adjacent to the temperature sensing section 90. The non-neighboring diode section 83 in the present example has a longer side and a shorter side. The non-neighboring diode section 83 has the longitudinal direction in the extending direction of the trench portion included in the transistor section 70. The non-neighboring diode section 83 includes a non-neighboring diode section 83a and a non-neighboring diode section 83b.

The non-neighboring diode section 83a has a pattern different from the pattern of the neighboring diode section 81 in the top view. In the present specification, the pattern refers to outer periphery shapes of the transistor section 70 and the diode section 80 in the top view. The non-neighboring diode section 83a in the present example has a longer side in Y axis direction and a shorter side in X axis direction. The non-neighboring diode section 83a is different from the neighboring diode section 81 in the length in the longitudinal direction and the transverse direction. The non-neighboring diode section 83a is an example of a first non-neighboring diode section. Note that the width of the non-neighboring diode section 83a in X axis direction is narrower than the width of the non-neighboring transistor section 73a.

The non-neighboring diode section 83b has a pattern different from the pattern of the non-neighboring diode section 83a in the top view. The non-neighboring diode section 83b has the same pattern as the pattern of the neighboring diode section 81 in the top view. The non-neighboring diode section 83b in the present example has a longer side in Y axis direction and a shorter side in X axis direction. The non-neighboring diode section 83b has the same lengths as the lengths of the neighboring diode section 81 in the longitudinal direction and in the transverse direction. The non-neighboring diode section 83b is an example of a second non-neighboring diode section.

The temperature sensing section 90 has longer sides and shorter sides. A shorter side of the temperature sensing section 90 is adjacent to only one of the transistor section 70 and the neighboring diode section 81. In the present example, on the positive side of the temperature sensing section 90 in Y axis direction, the shorter side of the temperature sensing section 90 is adjacent to the neighboring transistor section 71 and not adjacent to the neighboring diode section 81. However, the temperature sensing section 90, on the shorter side, may be adjacent to both the transistor section 70 and the diode section 80.

On the other hand, the longer side of the temperature sensing section 90 is adjacent to the neighboring transistor section 71 and the neighboring diode section 81. In the present example, on the positive side and the negative side of the temperature sensing section 90 in X axis direction, the longer side of the temperature sensing section 90 is adjacent to the neighboring transistor section 71 and the neighboring diode section 81. The neighboring transistor section 71 and the neighboring diode section 81 are arrayed in the longitudinal direction. In the longitudinal direction of the temperature sensing section 90, a plurality of the neighboring transistor sections 71 and a plurality of the neighboring diode sections 81 may each be arrayed repeatedly.

The longer side of the neighboring diode section 81 is shorter than the longer side of the non-neighboring diode section 83. This makes it easier to make the neighboring transistor section 71 and the neighboring diode section 81 adjacent to the temperature sensing section 90 on the longer side of the temperature sensing section 90.

Also, the non-neighboring transistor section 73b and the non-neighboring diode section 83b are arrayed in Y axis direction. The non-neighboring transistor section 73b and the non-neighboring diode section 83b are arrayed in the longitudinal direction on the opposite side to each other having the temperature sensing section 90 therebetween, in the reversed order of the arrangement of the neighboring transistor section 71 and the neighboring diode section 81 arrayed in the longitudinal direction. That is, the non-neighboring transistor section 73b may be provided on negative side in Y axis direction, relative to the non-neighboring diode section 83b.

The semiconductor device 100 in the present example can accurately detect both temperature of the transistor section 70 when current is applied and temperature of the diode section 80 when current is applied, by making the temperature sensing section 90 adjacent to the transistor section 70 and the diode section 80. That is, the accuracy in detection of temperature of the transistor section 70 when current is applied and temperature of the diode section 80 when current is applied can improve. Thereby, the accuracy in the protecting operation of the semiconductor device 100 can improve.

A ratio of the transistor section 70 to the diode section 80 adjacent to the temperature sensing section 90 may be determined considering the difference between the temperature detected by the temperature sensing section 90 and maximum temperature of the semiconductor device 100. The increasing ratio of the transistor section 70 adjacent to the temperature sensing section 90 leads the temperature sensing section 90 to get more easily affected by heat generated by the transistor section 70. On the other hand, the increasing ratio of the diode section 80 adjacent to the temperature sensing section 90 leads the temperature sensing section 90 to get more easily affected by heat generated by the diode section 80.

Here, the smaller chip size may cause the area of the diode section 80 to be smaller than the area of the transistor section 70. In this case, the semiconductor device 100 is more affected by the heat generated by the diode section 80. Thus, the semiconductor device 100 may make the ratio of the diode section 80 adjacent to the temperature sensing section 90 greater than the ratio of the transistor section 70 adjacent to the temperature sensing section 90. This makes it easier to make the temperature sensing section 90 accurately detect the maximum temperature of the chip of the semiconductor device 100.

As described above, the semiconductor device 100 includes the neighboring diode section 81 adjacent to the temperature sensing section 90, and thus can decrease the difference between the chip maximum temperature and temperature that is detected to activate a chip overheat protection function of the diode section 80 when current is applied is detected. Thereby, the semiconductor device 100 can improve the accuracy of the chip protecting operation.

Figure 2:
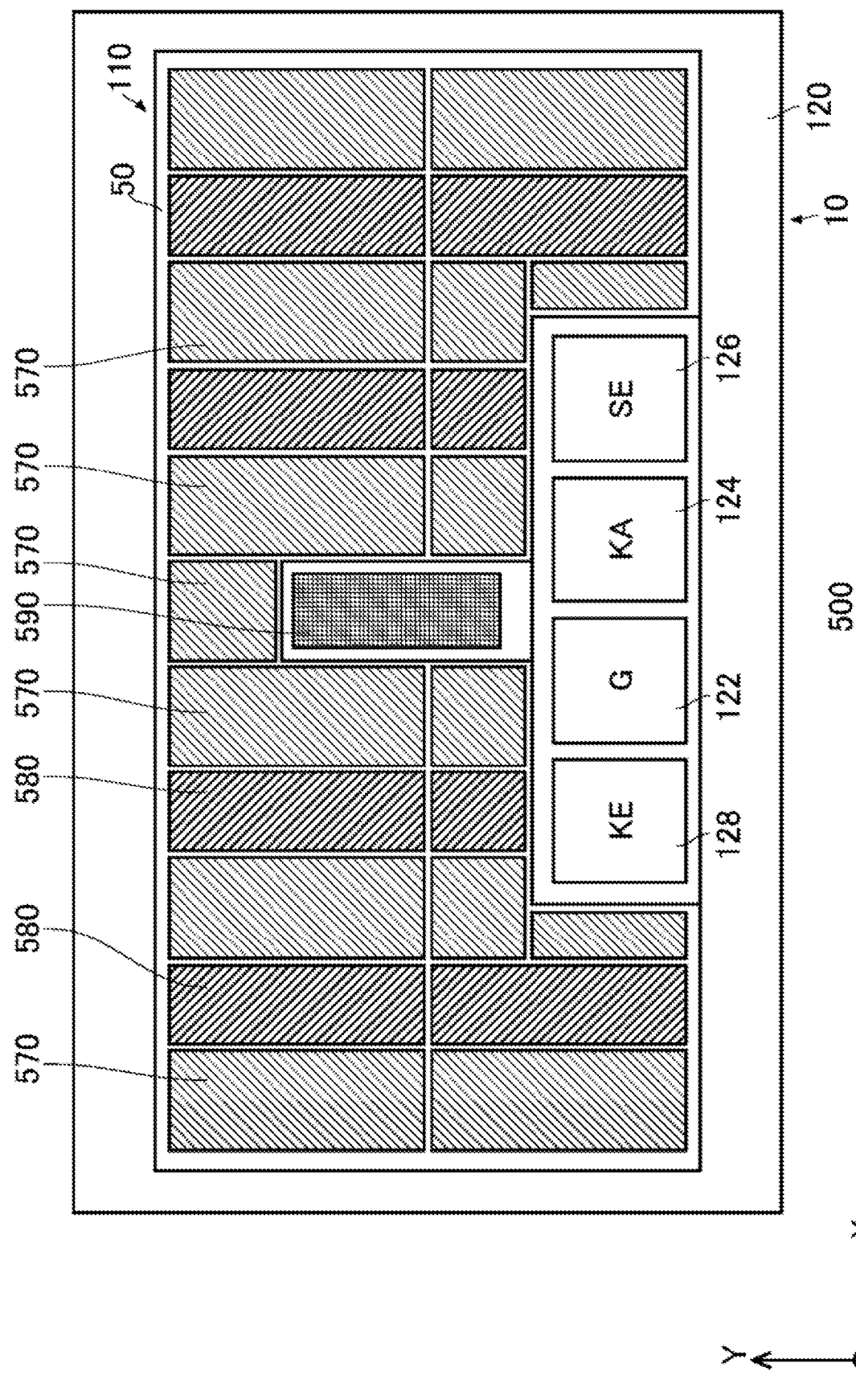
FIG. 2 shows an exemplary top view of a semiconductor device 500 according to the comparative example.

FIG. 2 shows an exemplary top view of a semiconductor device 500 according to a comparative example. The semiconductor device 500 in the present example includes transistor sections 570 and diode sections 580. The transistor section 570 and the diode section 580 have patterns and positions different from the patterns and the positions of the transistor section 70 and the diode section 80 according to the example 1.

The temperature sensing section 590 is adjacent to the transistor section 570, but not adjacent to the diode section 580. This leads the temperature sensing section 590 to get more easily affected by heat generated by the transistor section 570. If the diode section 580 is in electrical conduction and generates heat, the accuracy in temperature detection is decreased due to the heat generated by the diode section 580. Especially, if the diode section 580 generates heat to cause the chip maximum temperature to be reached, the temperature sensing section 590 cannot detect the chip maximum temperature accurately. Thereby, the accuracy in the protecting operation of the semiconductor device 500 gets worse.

Figure 3:
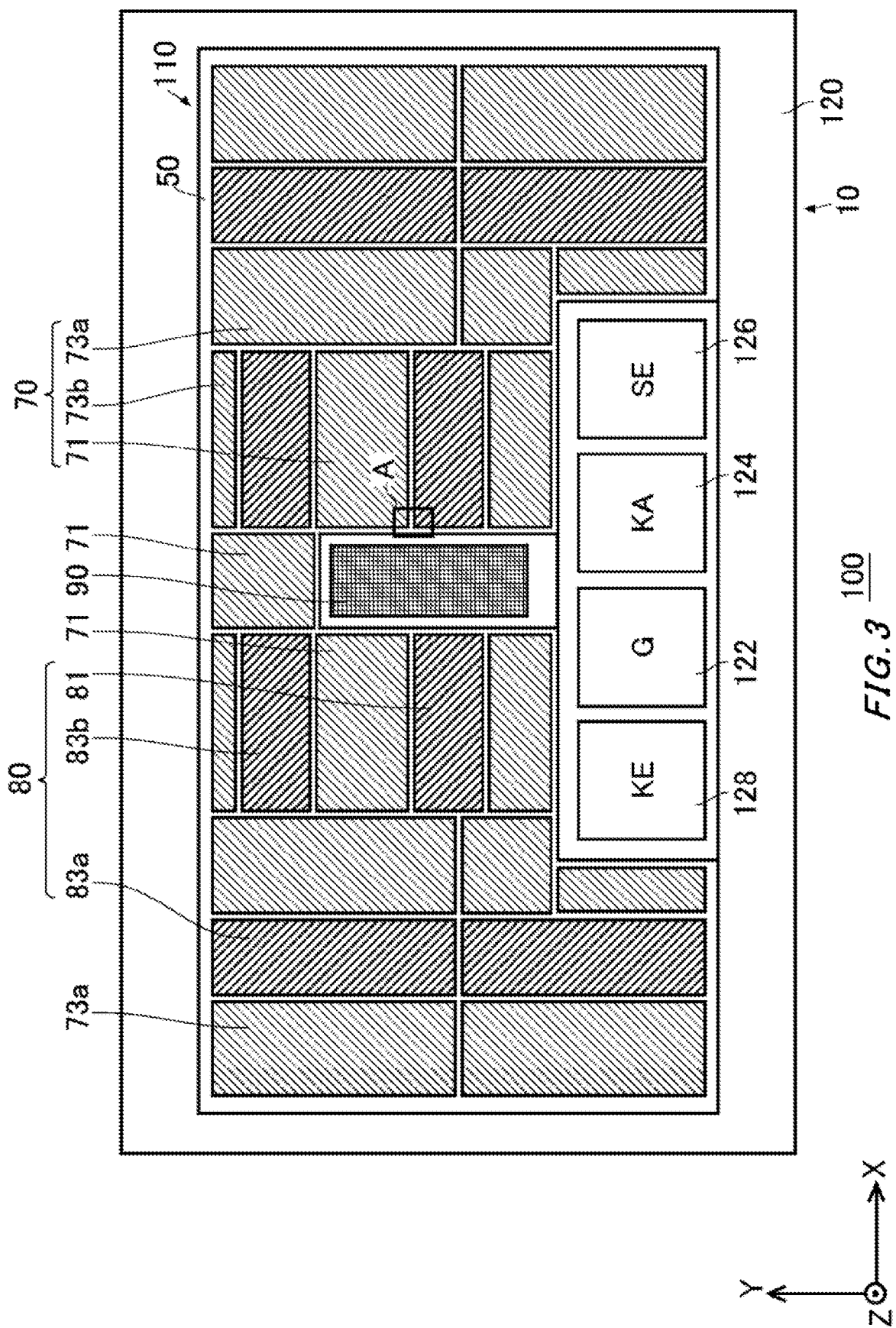
FIG. 3 shows an exemplary top view of a semiconductor device 100 according to the example 2.

FIG. 3 shows an exemplary top view of a semiconductor device 100 according to Example 2. The semiconductor device 100 in the present example has an arrangement different from the arrangement of the transistor section 70 and the diode section 80 in the semiconductor device 100 according to the example 1.

The neighboring transistor section 71 has a longitudinal direction in a direction orthogonal to the longitudinal direction of the temperature sensing section 90. The longitudinal direction of the temperature sensing section 90 in the present example is in Y axis direction. Accordingly, the longitudinal direction of the neighboring transistor section 71 is in X axis direction. The neighboring transistor section 71 is adjacent to the temperature sensing section 90. A gate metal layer 50 may be provided between the neighboring transistor section 71 and the temperature sensing section 90.

The non-neighboring transistor section 73a has a longitudinal direction in the extending direction of the trench portion included in the transistor section 70. The trench portion in the transistor section 70 in the present example extends in Y axis direction. The longitudinal direction of the non-neighboring transistor section 73a is in Y axis direction. The longitudinal direction of the non-neighboring transistor section 73a is the same as the longitudinal direction of the temperature sensing section 90. The non-neighboring transistor section 73a is not adjacent to the temperature sensing section 90. The non-neighboring transistor section 73a in the present example has a pattern different from the pattern of the neighboring transistor section 71 in the top view.

The non-neighboring transistor section 73b has a longitudinal direction in X axis direction. That is, the non-neighboring transistor section 73b has a longitudinal direction in a direction orthogonal to the longitudinal direction of the temperature sensing section 90. Also, with regard to the non-neighboring transistor section 73b, the array direction of the trench portion thereof is the longitudinal direction. The non-neighboring transistor section 73b has a pattern different from the pattern of the non-neighboring transistor section 73a. Also, the non-neighboring transistor section 73b in the present example has, but not limited to, a pattern different from the pattern of the neighboring transistor section 71 in the top view. In the present example, the non-neighboring transistor section 73b is arranged between the outer peripheral region 120 and the non-neighboring diode section 83b, and has a width narrower than the width of the neighboring transistor section 71 in Y axis direction.

The neighboring diode section 81 has a longitudinal direction in the array direction of the trench portion included in the transistor section 70. The trench portion in the transistor section 70 in the present example is arrayed in X axis direction. The neighboring diode section 81 has a longitudinal direction in a direction orthogonal to the longitudinal direction of the temperature sensing section 90. That is, the neighboring diode section 81 has a longitudinal direction in X axis direction.

The non-neighboring diode section 83a has a longitudinal direction in the extending direction of the trench portion included in the transistor section 70. The non-neighboring diode section 83a has a longitudinal direction in a direction parallel to the longitudinal direction of the temperature sensing section 90. That is, the non-neighboring diode section 83 has the longitudinal direction in Y axis direction. Note that the width of the non-neighboring diode section 83a in X axis direction is narrower than the width of the non-neighboring transistor section 73a.

The non-neighboring diode section 83b has a longitudinal direction in the array direction of the trench portion included in the transistor section 70. The non-neighboring diode section 83b has a longitudinal direction in a direction orthogonal to the longitudinal direction of the temperature sensing section 90. That is, the non-neighboring diode section 83b has the longitudinal direction in X axis direction. The non-neighboring diode section 83b has a pattern different from the pattern of the non-neighboring diode section 83a. The non-neighboring diode section 83b in the present example has, but not limited to, the same pattern as the pattern of the neighboring diode section 81 in the top view.

At least one of the neighboring transistor section 71 and the neighboring diode section 81 is adjacent to the one side of the temperature sensing section 90 at two points. In the present example, the neighboring transistor section 71 is adjacent to the longer side of the temperature sensing section 90 at two points. Thereby, the temperature sensing section 90 gets affected by the heat generated by both the transistor section 70 and the diode section 80. Accordingly, even if one of the transistor section 70 and the diode section 80 generates heat, the temperature sensing section 90 prevents the accuracy in the protecting operation of the semiconductor device 100 from getting worse.

For example, the temperature sensing section 90 may be arranged such that the length of the boundary of temperature sensing section 90 adjacent to the neighboring transistor section 71 is the same as the length of the boundary of the temperature sensing section 90 adjacent to the neighboring diode section 81. The length of the boundary between the temperature sensing section 90 and the neighboring transistor section 71 may be the same as the length of the boundary between the temperature sensing section 90 and the neighboring diode section 81. Also, a ratio of the length of the boundary between the temperature sensing section 90 and the neighboring transistor section 71 to the length of the boundary between the temperature sensing section 90 and the neighboring diode section 81 may be 1:3, 1:2, 2:1, or 3:1. The boundaries between the temperature sensing section 90 and both the transistor section 70 and the diode section 80 may be appropriately changed depending on the areas or applications of the transistor section 70 and the diode section 80 in the semiconductor device 100.

Note that the longitudinal direction and the transverse direction of the transistor section 70, the diode section 80, and the temperature sensing section 90 may be appropriately interchanged. Also, the arrangement of the semiconductor device 100 in the present example may be used in appropriate combination with the arrangement of the semiconductor device 100 according to the example 1.

Figure 4:
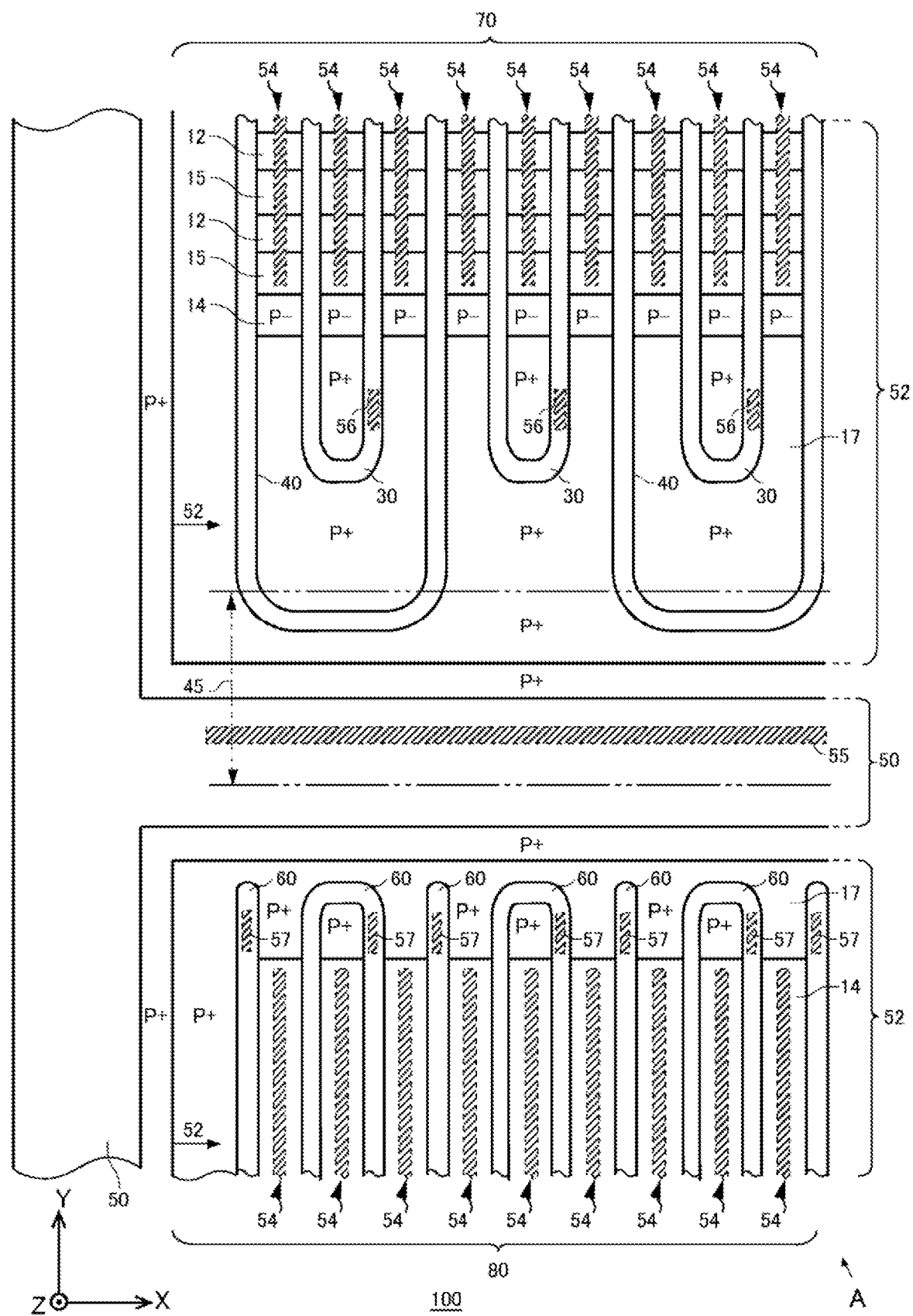
FIG. 4 shows an exemplary enlarged view of a region A of the semiconductor device 100 in the example 2.

FIG. 4 shows an exemplary enlarged view of the region A of the semiconductor device 100 in the example 2. The figure shows an enlarged view of the region A in FIG. 3. Note that the configuration of the semiconductor device 100 in the present example may be used in combination with any other example.

The semiconductor device 100 has, on the upper surface side of the semiconductor substrate 10, emitter regions 12, base regions 14, contact regions 15, and well regions 17. In the semiconductor substrate 10, dummy trench portions 30, gate trench portions 40, and emitter trench portions 60 are provided. The semiconductor device 100 has emitter electrodes 52 and gate metal layers 50 above the semiconductor substrate 10.

The gate trench portions 40 are arrayed at a predetermined interval along a predetermined array direction (X axis direction, in the present example). The gate trench portions 40 in the present example extend along an extending direction that is parallel to the upper surface of the semiconductor substrate 10 and perpendicular to the array direction (Y axis direction, in the present example). The gate trench portions 40 are connected, at end portions thereof, to the gate metal layers 50 on the negative side in Y axis direction.

The dummy trench portions 30, like the gate trench portions 40, are arrayed at a predetermined interval along a predetermined array direction (X axis direction in the present example). The dummy trench portions 30 in the present example extend along an extending direction that is parallel to the upper surface of the semiconductor substrate 10 and perpendicular to the array direction (Y axis direction, in the present example). The dummy trench portions 30 in the present example, like the gate trench portions 40, may have U-shapes on the upper surface of the semiconductor substrate 10.

On the upper surface of the semiconductor substrate 10, the emitter trench portions 60 have U-shapes on the positive side in Y axis direction. Also, the emitter trench portions 60 may have U-shapes on the negative side in Y axis direction. The emitter trench portions 60 may have emitter conductive portions electrically connected to the emitter electrode 52 via contact holes 57.

The emitter electrode 52 is formed of material including metal. For example, at least part of a region of the emitter electrode 52 may be formed of aluminum, aluminum-silicon alloy, or aluminum-silicon-copper alloy. At least part of a region of the gate metal layer 50 may be formed of aluminum, aluminum-silicon alloy, or aluminum-silicon-copper alloy. The emitter electrode 52 may have, in an under layer of the region formed of aluminum or the like, barrier metal that is formed of titanium, titanium compounds, or the like. Note that a gate metal layer may be provided above the semiconductor substrate 10.

The emitter electrodes 52 are provided above the semiconductor substrate 10, having the interlayer dielectric film therebetween. The interlayer dielectric film is omitted in the figure. In the interlayer dielectric film, contact holes 54, a contact hole 55, contact holes 56, and contact holes 57 are provided penetrating the interlayer dielectric film.

The contact holes 54 are provided in the transistor section 70 and the diode section 80. The contact holes 54 electrically connect the emitter electrodes 52 and the upper surface of the semiconductor substrate 10. For example, in the transistor section 70, the contact holes 54 electrically connect between the emitter electrode 52 and both the emitter regions 12 and the contact regions 15 that are provided on the upper surface of the semiconductor substrate 10. Also, in the diode section 80, the contact holes 54 electrically connect between the emitter electrode 52, and the base regions 14 provided on the upper surface of the semiconductor substrate 10.

The contact hole 55 is provided below the gate metal layer 50. The contact hole 55 connects the gate metal layer 50 and a gate runner 45. Inside the contact hole 55, a plug formed of tungsten or the like may be formed.

The contact holes 56 are provided in the transistor section 70. The contact holes 56 electrically connect dummy conductive portions of the dummy trench portions 30 and the emitter electrode 52.

The contact holes 57 are provided in the diode section 80. The contact holes 57 electrically connect emitter conductive portions of the emitter trench portions 60 and the emitter electrode 52.

The gate runner 45 connects the gate metal layer 50 and the gate trench portions 40 of the transistor section 70. The gate runner 45 is connected to gate conductive portions in the gate trench portions 40 on the upper surface of the semiconductor substrate 10. The gate runner 45 is not connected to the dummy conductive portions of the dummy trench portions 30. For example, the gate runner 45 is formed of polysilicon that is doped with impurities or the like.

The gate runner 45 in the present example is formed from below the contact holes 55 to edge portions of the gate trench portions 40. An insulating film such as an oxide film is formed between the gate runner 45 and the upper surface of the semiconductor substrate 10. In the edge portions of the gate trench portion 40, the gate conductive portions are exposed on the upper surface of the semiconductor substrate 10. The gate trench portions 40 are in contact with the gate runner 45 at the exposed portion of the gate conductive portions.

The base regions 14 are regions having second conductivity type that are provided on the upper surface side of the semiconductor substrate 10 in the transistor section 70 and the diode section 80. The base regions 14 have P(−)-type, as an example.

The emitter regions 12 are provided in contact with at least one of the dummy trench portions 30 and the gate trench portions 40 on the upper surface of the semiconductor substrate 10. The emitter region 12 is provided in X axis direction from one of two trench portions of the transistor section 70 through the other one of the two trench portions. The emitter regions 12 are also provided below the contact holes 54. The boundary areas where the emitter regions 12 overlap the contact holes 54 in the top view are depicted by dashed lines.

Also, the emitter regions 12 may be or may not be in contact with the dummy trench portions 30. In the present example, the emitter regions 12 are in contact with the dummy trench portions 30. The emitter regions 12 in the present example have first conductivity type. The emitter regions 12 in the present example have N(+)-type, as an example.

The contact regions 15 are regions having second conductivity type that have doping concentration higher than the doping concentration of the base regions 14. The contact regions 15 in the present example have P(+)-type, as an example. The contact regions 15 in the present example are provided on the upper surface of the semiconductor substrate 10. The contact regions 15 may be or may not be in contact with the gate trench portions 40. Also, the contact regions 15 may be or may not be in contact with the dummy trench portions 30. In the present example, the contact regions 15 are in contact with the dummy trench portions 30 and the gate trench portions 40. The contact regions 15 are also provided below the contact holes 54. The boundary areas where the contact regions 15 overlap the contact holes 54 in the top view are depicted by dashed lines.

Even if the transistor section 70 is provided adjacent to the temperature sensing section 90 as in the present example, the gate metal layer 50 may be provided between the transistor section 70 and the temperature sensing section 90. However, a distance between the transistor section 70 and the temperature sensing section 90 is preferably sufficiently small such that, if the transistor section 70 is generating heat, the difference between the temperature detected by the temperature sensing section 90 and the maximum temperature of the semiconductor device 100 falls within the design range.

Also, even if the diode section 80 is provided adjacent to the temperature sensing section 90, the gate metal layer 50 may be provided between the diode section 80 and the temperature sensing section 90. However, a distance between the diode section 80 and the temperature sensing section 90 is preferably sufficiently small such that, if the diode section 80 is generating heat, the difference between the temperature detected by the temperature sensing section 90 and the maximum temperature of the semiconductor device 100 falls within the design range.

Figure 5:
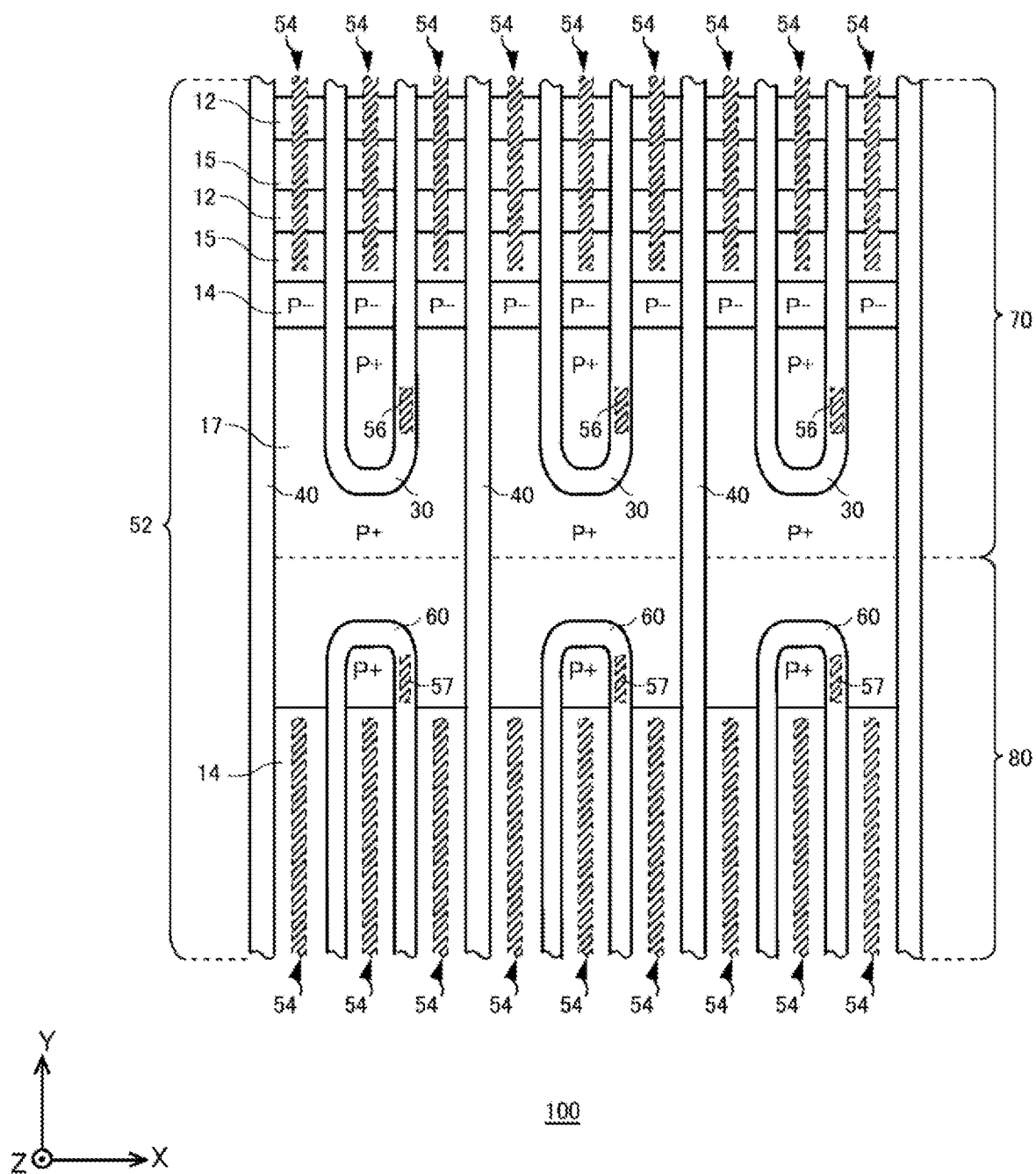
FIG. 5 shows an example where gate trench portions 40 penetrate diode sections 80.

FIG. 5 shows an example where the gate trench portions 40 penetrate the diode sections 80. Note that the configuration of the semiconductor device 100 in the present example may be used in combination with any other examples.

The gate trench portions 40 are provided penetrating the diode section 80 from the transistor section 70. The gate trench portions 40 in the present example are provided penetrating the diode section 80 in Y axis direction. By penetrating the diode section 80, the gate trench portions 40 does not need to have the gate metal layer 50 provided between the transistor section 70 and the diode section 80. Thus, the degree of freedom of the wiring of the gate metal layer 50 improves. If the degree of freedom of the wiring of the gate metal layer 50 improves, the degree of freedom of the arrangement of the neighboring transistor section 71 and the neighboring diode section 81 can also improve. For example, even if the diode section 80 has the longer side in X axis direction, the gate trench portion 40 can be connected to the gate metal layer 50 over the diode section 80.

Note that the well regions 17 are provided between the transistor section 70 and the diode section 80. Also, the gate metal layer 50 is not provided between the transistor section 70 and the diode section 80. Thus, the emitter electrode 52 is provided extending from the transistor section 70 to the diode section 80.

Figure 6:
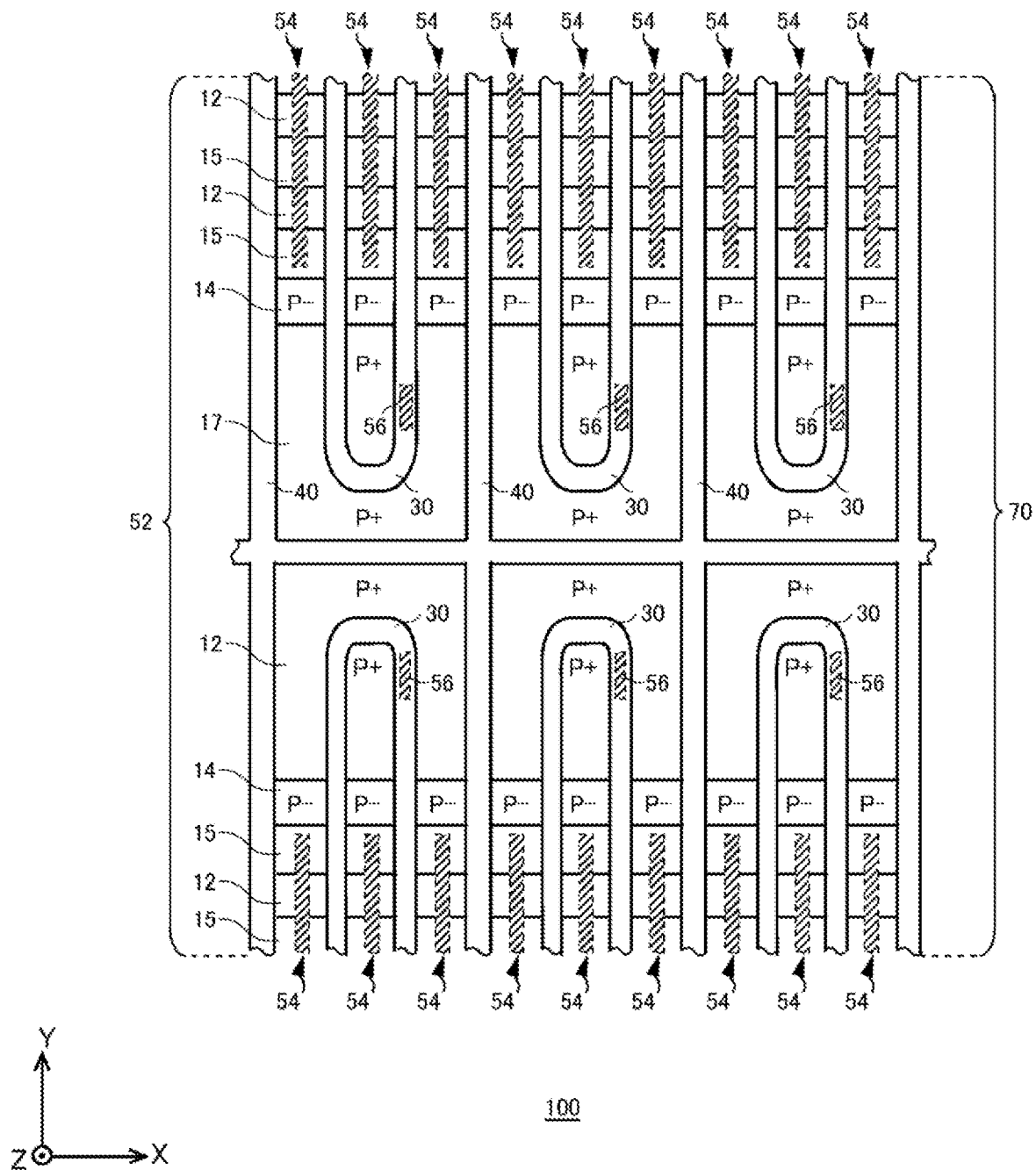
FIG. 6 shows exemplary gate trench portions 40 provided in the transistor section 70.

FIG. 6 shows exemplary gate trench portions 40 provided in the transistor section 70. Note that the configuration of the semiconductor device 100 in the present example may be used in combination with any other example.

The gate trench portions 40 penetrate the transistor section 70 in X axis direction. Thereby, the gate trench portions 40 are connected to the gate metal layer 50 at parts nearby. By improving the degree of freedom of the wiring of the gate trench portions 40, the degree of freedom of the arrangement of the transistor section 70 and the diode section 80 can improve. For example, the gate trench portions 40 are connected to the gate metal layer 50 provided on outer periphery of the active region 110. Also, the gate trench portion 40 may be connected to the gate metal layer 50 provided surrounding the temperature sensing section 90.

Note that, in the present example, a case where the gate trench portions 40 penetrate transistor section 70 in X axis direction has been described, but the gate trench portions 40 may penetrate the diode section 80 in X axis direction. The present example may be used in combination with the example, as shown in FIG. 5, where the gate trench portions 40 penetrate the transistor section 70 and the diode section 80 in Y axis direction.

Figure 7:
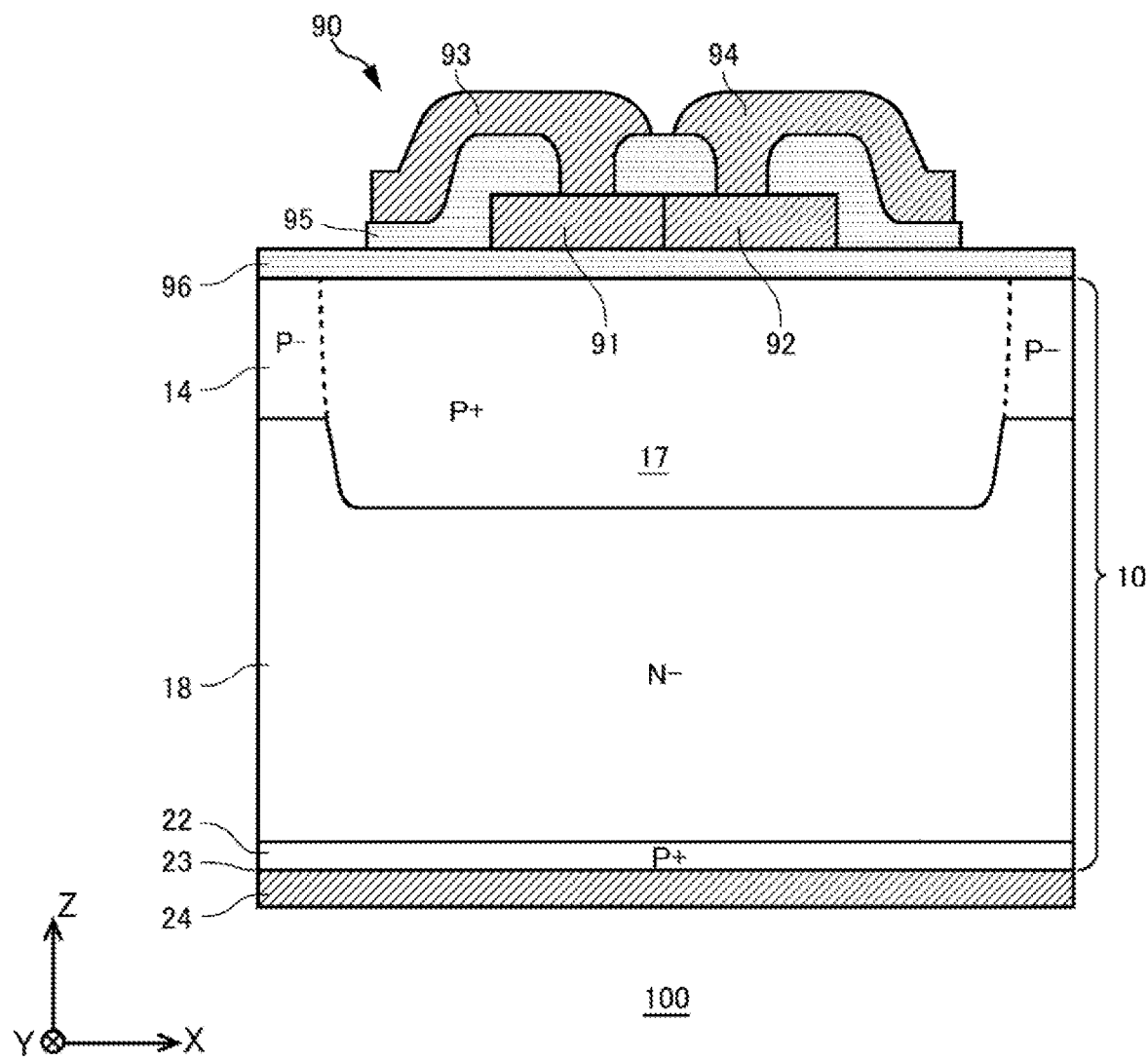
FIG. 7 shows an exemplary cross section of the temperature sensing section 90.

FIG. 7 shows an exemplary cross section of the temperature sensing section 90. The figure in particular shows a cross section of an area near the region where the temperature sensing section 90 has been formed.

The temperature sensing section 90 has a PN diode to detect the temperature of the semiconductor device 100. The temperature sensing section 90 detects the temperature of the semiconductor device 100 using current-voltage characteristic of the PN diode that changes depending on temperature. The temperature sensing section 90, having the insulating film 96 therebetween, is arranged above the semiconductor substrate 10. Also, the temperature sensing section 90 is formed above the well regions 17. The temperature sensing section 90 in the present example includes a first conductivity type region 91, a second conductivity type region 92, a first connecting portion 93, a second connecting portion 94, and an insulating film 95.

The first conductivity type region 91 and the second conductivity type region 92 constitute the PN diode. For example, the first conductivity type region 91 is formed of N-type semiconductor, and the second conductivity type region 92 is formed of P-type semiconductor. The first conductivity type region 91 and the second conductivity type region 92 are provided on the insulating film 96.

The first connecting portion 93 is electrically connected to the first conductivity type region 91. The second connecting portion 94 is electrically connected to the second conductivity type region 92. The first connecting portion 93 and the second connecting portion 94 are electrically connected to the temperature measuring pad 124 with the temperature sensing wire.

The insulating film 95 is provided on the first conductivity type region 91 and the second conductivity type region 92. Also, the insulating film 95 is provided on the insulating film 96. The insulating film 95 has an opening to electrically connect the first connecting portion 93 to the first conductivity type region 91. The insulating film 95 has an opening to electrically connect the second connecting portion 94 to the second conductivity type region 92.

The drift region 18 is a region having first conductivity type that is provided on the semiconductor substrate 10. The drift region 18 in the present example has N(−)-type, as an example. The drift region 18 may be a remaining region where the other doped regions have been not formed in the semiconductor substrate 10. That is, the doping concentration of the drift region 18 may be the doping concentration of the semiconductor substrate 10.

The collector region 22 is a region having second conductivity type that is provided on the lower surface side of the semiconductor substrate 10. The collector region 22 has P(+)-type, as an example. The collector region 22 is provided on the lower surface side of the drift region 18.

The collector electrode 24 is formed on the lower surface 23 of the semiconductor substrate 10. The collector electrode 24 is formed of conductive material such as metal.

The temperature sensing section 90 in the present example has well regions 17 in a corresponding area on the lower surface side of the semiconductor substrate 10. Element regions such as the transistor section 70 and the diode section 80 may be provided below the temperature sensing section 90. The collector region 22 is provided below the temperature sensing section 90 in the present example. That is, the temperature sensing section 90 is provided in the transistor section 70.

Also, the temperature sensing section 90 may be provided in the diode section 80. In this case, below the temperature sensing section 90, a cathode region having first conductivity type is provided as an alternative to the collector region 22. For example, the cathode region has N(+)-type conductivity type. Note that, below the temperature sensing section 90, the boundary between the transistor section 70 and the diode section 80 may be provided.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising a transistor section and a diode section, the semiconductor device including:
   a temperature sensing section;
   a neighboring transistor section adjacent to the temperature sensing section;
   a neighboring diode section adjacent to the temperature sensing section; and
   a first non-neighboring diode section that is not adjacent to the temperature sensing section, wherein the first non-neighboring diode section has a pattern different from a pattern of the neighboring diode section in a top view, and
the neighboring transistor section and the neighboring diode section are spaced apart from the temperature sensing section by a gate metal layer surrounding the temperature sensing section.

2. The semiconductor device according to claim 1, wherein
the temperature sensing section has a longer side and a shorter side, and is, on the shorter side, adjacent to only one of the neighboring transistor section and the neighboring diode section.

3. The semiconductor device according to claim 1, wherein
the transistor section has a non-neighboring transistor section that is not adjacent to the temperature sensing section, and
the neighboring diode section and the neighboring transistor section are adjacent to a longer side of the temperature sensing section and arrayed in a longitudinal direction.

4. The semiconductor device according to claim 3, further comprising a second non-neighboring diode section that is not adjacent to the temperature sensing section, wherein
the second non-neighboring diode section and the non-neighboring transistor section are arrayed in the longitudinal direction on an opposite side to the temperature sensing section, in a reversed order of an arrangement of the neighboring diode section and the neighboring transistor section that are arrayed in the longitudinal direction.

5. The semiconductor device according to claim 4, wherein the second non-neighboring diode section has a pattern same as a pattern of the neighboring diode section in a top view.

6. The semiconductor device according to claim 1, wherein
the neighboring transistor section and the neighboring diode section have a longitudinal direction in an extending direction of trench portions included in the transistor section.

7. The semiconductor device according to claim 1, wherein
the neighboring diode section has a longitudinal direction in a direction orthogonal to a longitudinal direction of the temperature sensing section, and
the first non-neighboring diode section has a longitudinal direction in a direction parallel to a longitudinal direction of the temperature sensing section.

8. The semiconductor device according to claim 7, wherein
at least one of the neighboring diode section and the neighboring transistor section is adjacent to the temperature sensing section on one side of the temperature sensing section at two points.

9. The semiconductor device according to claim 1, wherein
the temperature sensing section does not overlap the neighboring transistor section and the neighboring diode section in the top view.

10. The semiconductor device according to claim 1, wherein
a portion of the neighboring diode section is larger than a portion of the neighboring transistor section, the portions being adjacent to the temperature sensing section.

11. A semiconductor device comprising a transistor section and a diode section, the semiconductor device including:
a temperature sensing section;
a neighboring transistor section adjacent to the temperature sensing section;
a neighboring diode section adjacent to the temperature sensing section;
a first non-neighboring diode section that is not adjacent to the temperature sensing section; and
a second non-neighboring diode section that is not adjacent to the temperature sensing section, wherein
the first non-neighboring diode section has a pattern different from a pattern of the neighboring diode section in a top view,
the transistor section has a non-neighboring transistor section that is not adjacent to the temperature sensing section,
the neighboring diode section and the neighboring transistor section are adjacent to a longer side of the temperature sensing section and arrayed in a longitudinal direction, and
the second non-neighboring diode section and the non-neighboring transistor section are arrayed in the longitudinal direction on an opposite side to the temperature sensing section, in a reversed order of an arrangement of the neighboring diode section and the neighboring transistor section that are arrayed in the longitudinal direction.

* * * * *